United States Patent
Muhitch et al.

(10) Patent No.: US 6,847,212 B1
(45) Date of Patent: Jan. 25, 2005

(54) APPARATUS AND METHOD FOR CALIBRATING VOLTAGE SPIKE WAVEFORMS

(75) Inventors: Joseph M. Muhitch, Exeter, RI (US); Edward W. Wilbur, Jr., Bristol, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/652,079

(22) Filed: Aug. 26, 2003

(51) Int. Cl.[7] .............................................. G01R 35/00
(52) U.S. Cl. ....................................... 324/601; 324/511
(58) Field of Search ................................. 324/601, 511

(56) References Cited

U.S. PATENT DOCUMENTS

| | | | | |
|---|---|---|---|---|
| 4,307,342 A | * | 12/1981 | Peterson ..................... | 324/767 |
| 4,843,515 A | * | 6/1989 | Richman ..................... | 361/58 |
| 4,926,285 A | * | 5/1990 | Reinhardt et al. ........... | 361/230 |
| 5,463,315 A | * | 10/1995 | Grace et al. .............. | 324/158.1 |
| 5,525,926 A | * | 6/1996 | Merritt ....................... | 327/535 |
| 5,537,044 A | * | 7/1996 | Stahl .......................... | 324/511 |
| 5,623,215 A | * | 4/1997 | Maytum ..................... | 324/765 |
| 5,956,223 A | * | 9/1999 | Banting ...................... | 361/117 |
| 6,088,209 A | * | 7/2000 | Sink ........................... | 361/111 |
| 6,118,639 A | * | 9/2000 | Goldstein ................... | 361/55 |
| 6,304,839 B1 | * | 10/2001 | Ho et al. ..................... | 703/18 |
| 6,490,143 B1 | * | 12/2002 | Estrela et al. .............. | 361/113 |

* cited by examiner

Primary Examiner—Charles H. Nolan, Jr.
(74) Attorney, Agent, or Firm—James M. Kasischke; Michael F. Oglo

(57) ABSTRACT

An apparatus and method for calibrating single phase voltage spikes used in testing single phase electrical equipment. Capacitance is selected from a capacitor network in order to adjust the single phase voltage spike so as to produce a predetermined voltage spike waveform having particular waveform characteristics that are required to perform survivability and compatibility tests.

17 Claims, 4 Drawing Sheets

APPARATUS AND METHOD FOR CALIBRATING VOLTAGE SPIKE WAVEFORMS

CROSS-REFERENCE TO RELATED PATENT APPLICATIONS

This patent application is co-pending with one related patent application Ser. No. 10/652,078 entitled APPARATUS AND METHOD FOR CALIBRATING VOLTAGE SPIKE WAVEFORMS FOR THREE-PHASE ELECTRICAL DEVICES AND SYSTEMS by the same inventor as this application.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

The present invention generally relates to an apparatus and method for calibrating voltage spike waveforms that are used to test survivability and compatibility of an electrical device.

2. Description of the Prior Art

Many electrical devices, both military and commercial-off-the-shelf ("COTS"), have specifications that are incomplete with regard to compatibility and survivability. This problem is exacerbated when COTS devices are integrated with devices configured in accordance with military specifications such as onboard electronics of a submarine or other naval vessel. Vendors typically do not perform tests or evaluations on the compatibility and survivability characteristics of electrical devices.

What is needed is a technique for efficiently and inexpensively testing the compatibility and survivability of electrical devices.

Prior art systems and techniques for testing electrical devices with voltage spike waveforms and voltage spike suppression devices are disclosed in U.S. Pat. Nos. 4,307,342, 5,463,315, 5,525,926, 5,623,215 and 6,088,209. However, such prior art systems and techniques do not address the aforementioned problem or meet the aforementioned need.

SUMMARY OF THE INVENTION

It is therefore an object of the present invention to provide an apparatus and method for calibrating voltage spike waveforms that are used to test the survivability and compatibility characteristics of electrical equipment including military and commercial off-the-shelf electrical devices.

It is another object of the present invention that the aforesaid apparatus and method be relatively inexpensive to implement.

Other objects and advantages of the present invention will be apparent from the ensuing description.

Thus, the present invention is directed to, in one aspect, an apparatus for calibrating voltage spikes used in testing an electrical device, comprising an input for receiving a voltage spike, and power supply inputs for receiving power for energizing an electrical device under test. The power supply inputs comprise a high voltage input, a common input and a ground input. The apparatus further comprises a plurality of outputs comprising a high voltage output, a common output, and a ground output. The plurality of outputs are configured for connection to corresponding high voltage, common and ground inputs of the electrical device under test. The power supply common and ground inputs are connected to the common and ground outputs, respectively. The apparatus further comprises a circuit for connecting and disconnecting the power supply high voltage input to and from, respectively, the high voltage output, selecting a pair of the plurality of outputs, transforming the voltage spike into a predetermined voltage spike waveform, and applying the predetermined voltage spike waveform to the selected pair of outputs.

In a related aspect, the present invention is directed to a method of testing an electrical device, which includes providing an electrical device under test having high voltage, common and ground inputs, providing a power source for energizing the electrical device under test wherein the power source has high voltage, common and ground outputs, and connecting the common and ground outputs of the power source to the common and ground inputs of the electrical device under test. The method further comprises selecting a pair of the plurality of inputs of the electrical device, connecting the power supply high voltage input to the high voltage input of the electrical device under test if the selected pair comprises the high voltage and common inputs of the electrical device, generating a voltage spike, transforming the voltage spike into a predetermined voltage spike waveform, and applying the predetermined voltage spike waveform to the selected pair of inputs of the electrical device under test.

BRIEF DESCRIPTION OF THE DRAWINGS

The foregoing features of the present invention will become more readily apparent and may be understood by referring to the following detailed description of an illustrative embodiment of the present invention, taken in conjunction with the accompanying drawings, in which.

DESCRIPTION OF THE PREFERRED EMBODIMENTS

The present invention is directed to a single-phase voltage spike waveform calibrator for performing a voltage spike test on single-phase electrical devices and equipment under test.

Figure 1:
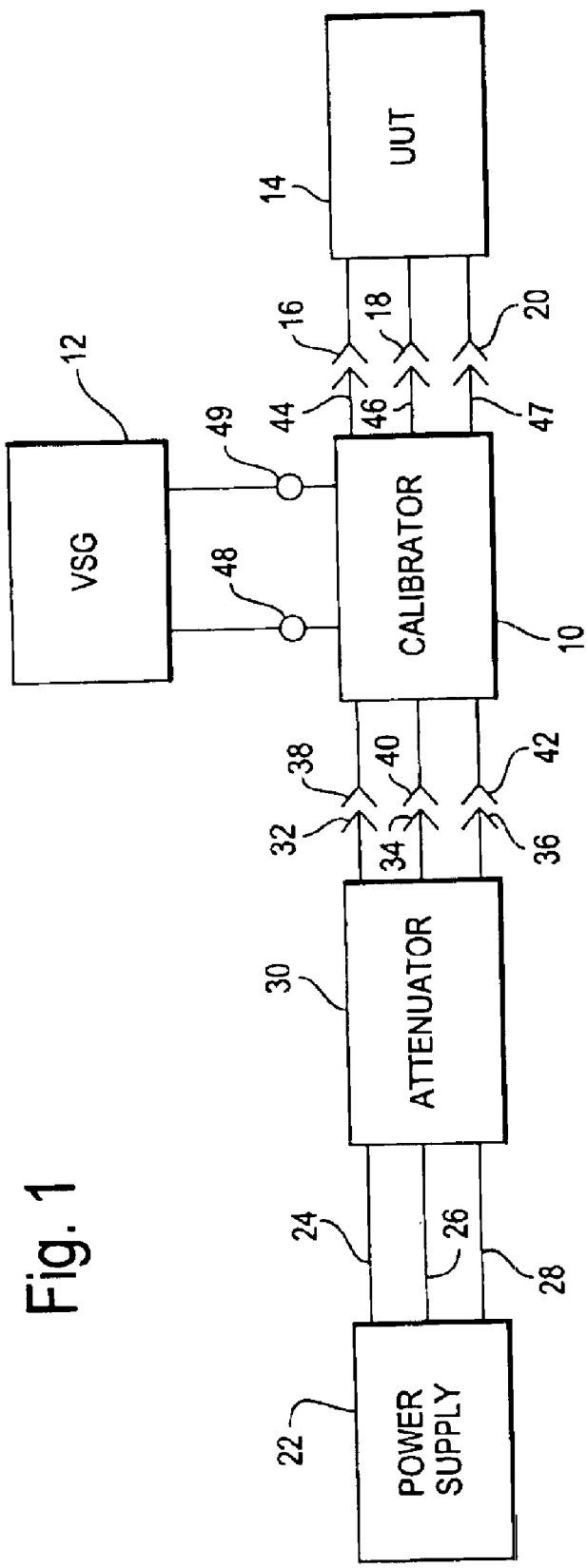
FIG. 1 is a block diagram showing a testing system that utilizes the apparatus of the present invention.

Referring to FIG. 1, there is shown a testing system that utilizes single phase voltage spike calibrator 10 of the present invention. Calibrator 10 receives and calibrates voltage spikes that are generated and provided by voltage spike generator ("VSG") 12. The system shown in FIG. 1 effects particular tests on the electrical device or unit under test ("UUT") 14 wherein each test entails providing a predetermined voltage spike waveform into UUT 14. UUT 14 can be any type of single phase electrical device. UUT 14 includes high voltage input 16, common input 18 and ground input 20. Specifically, calibrator 10 transforms the voltage spike provided by VSG 12 into particular voltage spike waveforms that are required for complete survivability and compatibility testing of UUT 14.

Three standard tests are commonly utilized. In the first test, calibrator 10 transforms the voltage spike provided by VSG 12 into a first predetermined voltage spike waveform which is applied to the high voltage input 16 and common input 18 of UUT 14. This test is referred to as the line-to-line test. In the second test, calibrator 10 transforms the voltage spike outputted by VSG 12 into a second predetermined voltage spike waveform which is applied to the high voltage input 16 and ground input 20 of UUT 14. This test is referred to as the high-to-ground test. In the third test, calibrator 10 transforms the voltage spike provided by VSG 12 into a third predetermined voltage spike waveform which is applied to the common input 18 and ground connector 20 of UUT 14. This third test is referred to as the common-to-ground test. In each of these aforesaid tests, each of the first, second, and third predetermined voltage waveforms may have the same or different waveform characteristics, e.g. peak voltage, overshoot, rise time, fall time, etc.

Referring to FIG. 1, power supply 22 provides a supply voltage and current to the UUT 14. Power supply 22 includes high voltage output 24, common output 26 and ground connector 28 that are inputted into attenuator 30. Attenuator 30 is connected between power supply 22 and calibrator 10 and attenuates high voltage spikes in order to prevent such spikes from being applied to power supply 22. Specifically, attenuator 30 is configured to attenuate the high frequency components of the voltage spike outputted by VSG 12. For example, attenuator 30 is configured to attenuate a voltage spike having a peak voltage of 1000 volts so as to yield a voltage spike having a peak voltage of 300 volts. Attenuator 30 includes high voltage line 32, common line 34 and ground line 36 that are connected corresponding to high voltage, common and ground inputs, respectively, calibrator 10. Attenuator 30 is well known in the art and is therefore not discussed in detail.

Calibrator 10 includes high voltage input 38, common input 40 and ground input 42 that are connected to high voltage line 32, common line 34 and ground line 36, respectively, of attenuator 30. Calibrator 10 further comprises high voltage output 44, common output 46 and ground output 47. Common input 40 is connected to common output 46. Ground input 42 is connected to ground output 47. Calibrator 10 further includes high voltage input 48 and common input 49 that are connected to the high voltage and common outputs, respectively, of VSG 12.

Figure 2A:
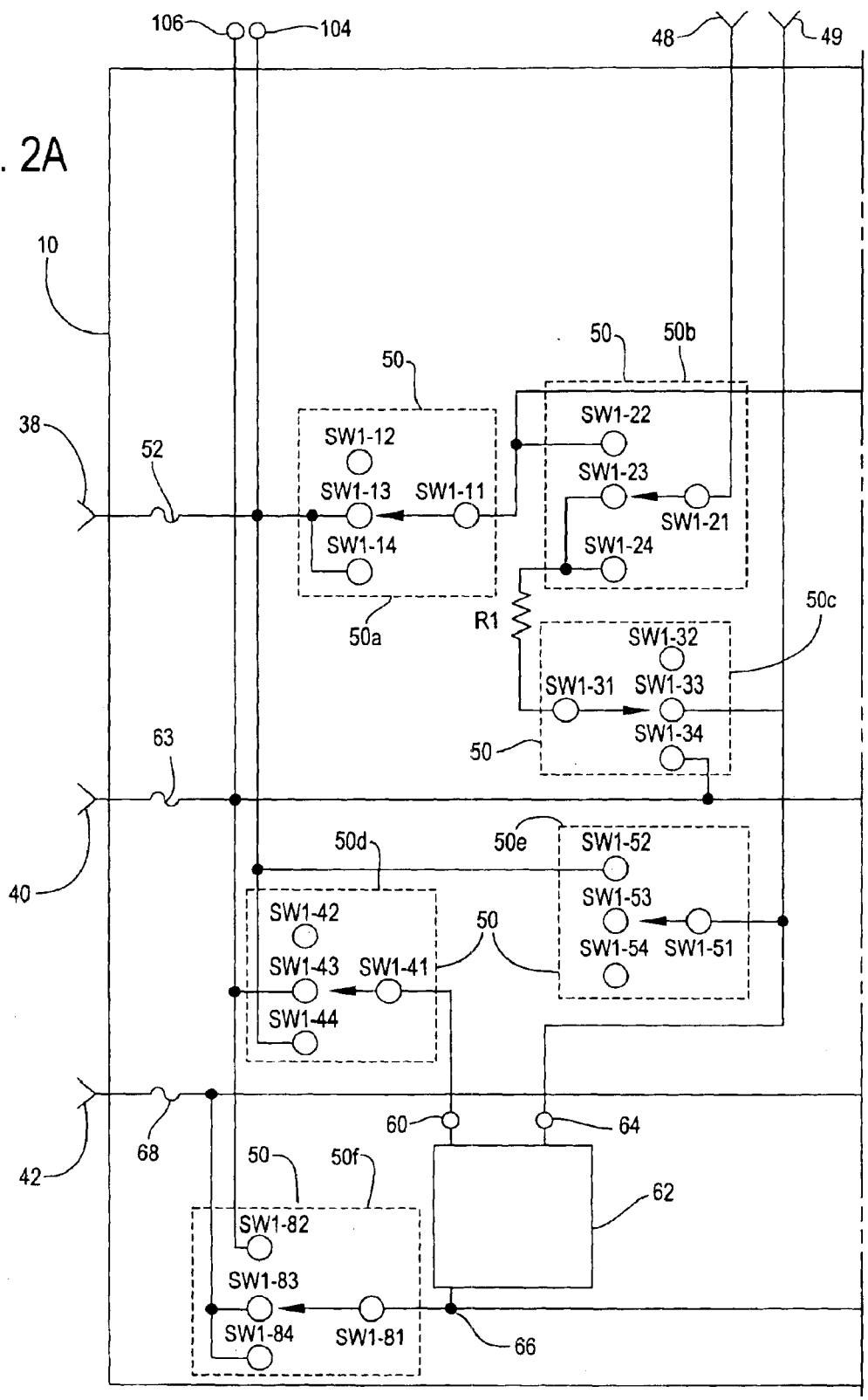
FIG. 2 is a schematic diagram of one embodiment of the apparatus of the present invention.
Figure 2B:
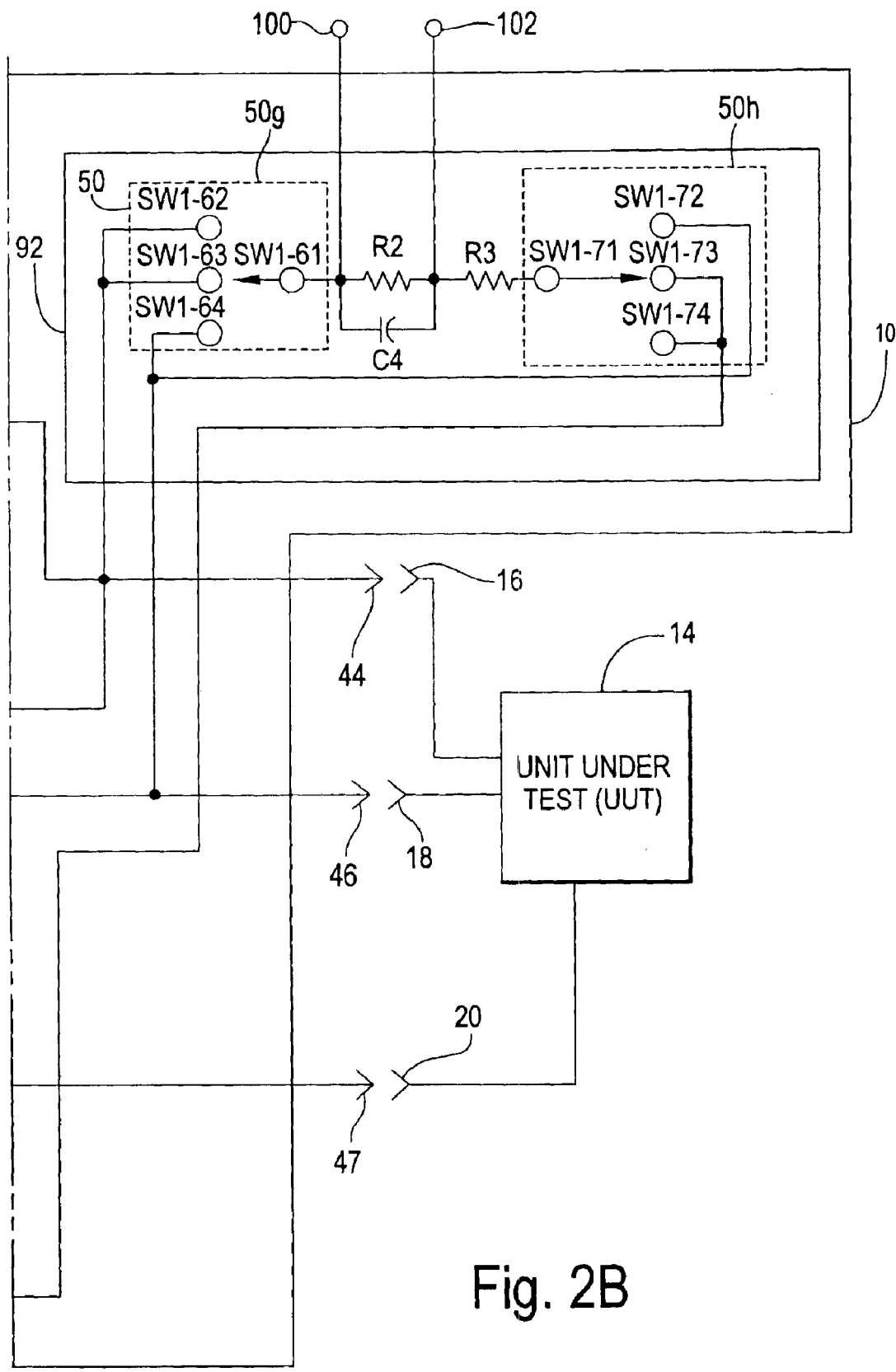

Referring to FIG. 2, calibrator 10 further includes switch 50 that comprises a plurality of groups 50*a–h* of switch contacts. Group 50*a* comprises switch contacts SW1-11, SW1-12, SW1-13, and SW1-14. Switch contact SW1-11 is connected to high voltage output 44 of calibrator 10. Switch contact SW1-12 is an open circuit. Switch contact SW1-13 is connected to switch contact SW1-14 and both switch contacts SW1-13 and SW1-14 are connected to one end of fuse 52. The other end of fuse 52 is connected to high voltage input 38.

Group 50*b* of switch contacts comprises switch contacts SW1-21, SW1-22, SW1-23 and SW1-24. Switch contact SW1-21 is connected to VSG high voltage input 48. Switch contact SW1-22 is connected to high voltage output 44. Switch contact SW1-23 is connected to switch contact SW1-24. Group 50*c* of switch contacts comprises switch contacts SW1-31, SW1-32, SW1-33 and SW1-34. Resistor R1 is connected between switch contact SW1-24 and switch contact SW1-31. In one embodiment, resistor R1 has a resistance of about one ohm. Switch contact SW1-32 is an open circuit. Switch contact SW1-33 is connected to high voltage output 44. Switch contact SW1-34 is connected to common output 46.

Group 50*d* comprises switch contacts SW1-41, SW1-42, SW1-43, and SW1-44. Switch contact SW1-41 is connected to node 60 of capacitive circuit 62. Capacitive circuit 62 is described in detail in the ensuing description. Switch contact SW1-42 is an open circuit. Switch contact SW1-43 is connected to one end of fuse 63. The other end of fuse 63 is connected to common input 40. Switch contact SW1-44 is connected to one end of fuse 52.

Group 50*e* comprises switch contacts SW1-51, SW1-52, SW1-53 and SW1-54. Switch contact SW1-51 is connected to VSG common input 49 and node 64 of capacitive circuit 62. Switch contact SW1-52 is connected to one end of fuse 52. Switch contacts SW1-53 and SW1-54 are open circuits.

Group 50*f* comprises switch contacts SW1-81, SW1-82, SW1-83, and SW1-84. Switch contact SW1-81 is connected to node 66 of capacitor network 62. Switch contact SW1-82 is connected to switch contact SW1-43 and one end of fuse 63. Switch contacts SW1-83 and SW1-84 are connected to one end of fuse 68. The other end of fuse 68 is connected to ground input 42.

Figure 3:
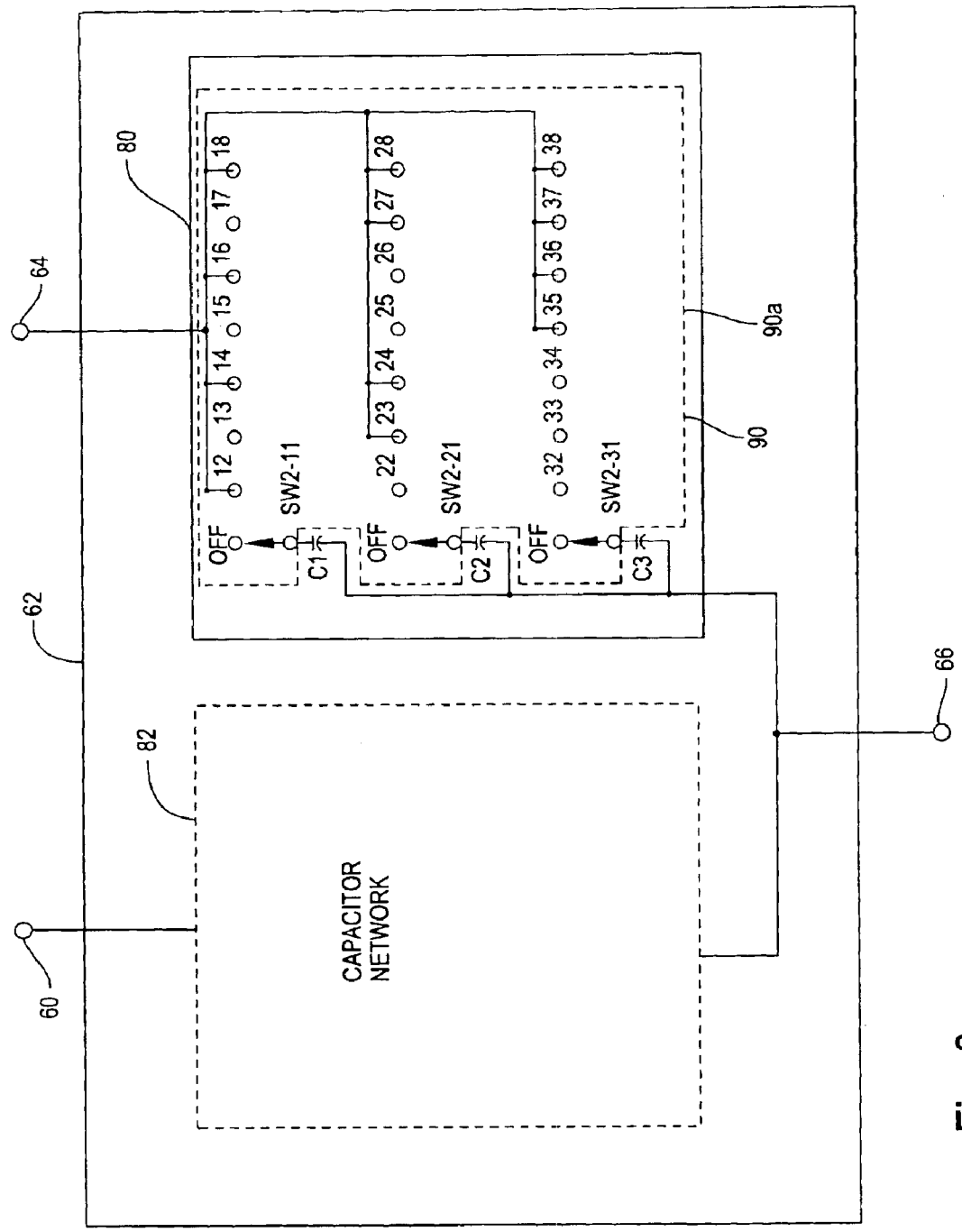
FIG. 3 is a schematic diagram of a capacitive circuit shown in FIG. 2.

Referring to FIGS. 2 and 3, capacitive circuit 62 comprises capacitor networks 80 and 82 and switch 90. Switch 90 comprises two groups of switch contacts. The first group, group 90*a*, comprises switch contacts SW2-11 through SW2-18, switch contacts SW2-21 through SW2-28, and switch contacts SW2-31 through SW2-38. Switch contacts SW2-13, SW2-15, SW2-17, SW2-22, SW2-25, SW2-26, SW2-32, SW2-33, and SW2-34 are open circuits. Network 80 comprises capacitors C1, C2, and C3. Switch 90 can be adjusted to produce a resultant capacitance between nodes 64 and 66 that is based on any one of capacitors C1, C2, and C3 by themselves or in any combination with each other. Hence, the resulting capacitance exhibited by network 80 can be any one of seven possible capacitances depending upon the setting of switch 90. The seven possible resulting capacitances are shown in Table I.

TABLE I

| Possible Resulting Capacitances |
|---|
| C1 |
| C2 |
| C3 |
| C1 + C2 |
| C1 + C3 |
| C2 + C3 |
| C1 + C2 + C3 |

In Table I, the sign "+" designates summation. In one embodiment, capacitor C1 has a capacitance of 5 uf (microfarads), capacitor C2 has a capacitance of 10 uf and capacitor C3 has a capacitance of 20 uf. Thus, in such an embodiment, the possible resulting capacitance is between 5 uf and 35 uf, inclusive.

Network 82 also comprises three capacitors and a second group of switch contacts that are part of switch 90. The aforesaid switch contacts and capacitors are connected in the same manner as capacitors C1, C2 and C3 and the switch contacts of group 90*a* described above. Switch 90 can be adjusted to produce a resultant capacitance between nodes 60 and 66 that is based on any one of capacitors in network by themselves or in any combination with each other. The resulting capacitance exhibited by network 82 can be any one of seven possible capacitances depending upon the setting of switch 90. In one embodiment, the capacitors in network 82 have the same capacitances as capacitors C1, C2 and C3. Thus, in such an embodiment, the possible resulting capacitance is also between 5 uf and 35 uf, inclusive.

In a preferred embodiment, switch 90 is configured so that the capacitance between nodes 60 and 66, and between nodes 64 and 66 is substantially the same at all times.

Calibrator 10 further includes monitoring circuit 92 for monitoring the voltage spike waveforms that are inputted into UUT 14. Monitoring circuit 92 is discussed in detail in the ensuing description.

In order to conduct the first test, known as the line-to-line test, UUT 14 is de-energize by inactivating power supply 22. Next, calibrator circuit 10 is connected between UUT 14 and power supply 22. In a preferred embodiment, attenuator 30 is connected between power supply 22 and calibrator 10. Next, UUT 14 is energized by activating power supply 22 and VSG 12 is connected to calibrator 10. Next, switch 50 is adjusted to implement the line-to-line test. When switch 50 is adjusted to implement the line-to-line test, each pair of switch contacts shown in each row of Table II are electrically connected together.

TABLE II

| SW1-11 | SW1-12 (open circuit) |
| SW1-21 | SW1-22 |
| SW1-31 | SW1-32 (open circuit) |
| SW1-51 | SW1-52 |
| SW1-41 | SW1-42 (open circuit) |
| SW1-81 | SW1-82 |

For example, switch contacts SW1-11 and SW1-12 are connected together, switch contacts SW1-51 and SW1-52 are connected together, and switch contacts SW1-81 and SW1-82 are connected together. As a result of each pair of switch contacts in each row of Table II being connected together, the VSG high voltage input 48 is connected to high voltage output 44. VSG common input 49 is connected to node 64 of capacitor network 82 and node 66 is connected to common input 40 via switch contacts SW1-81 and SW1-82. Switch contact SW1-41 is connected to SW1-42 which is connected to an open circuit. Therefore, capacitor network 82 is out of the circuit.

Next, switch 90 is adjusted to exhibit a desired resulting capacitance between nodes 64 and 66. The actual desired resulting capacitance is appropriate for conducting the line-to-line test. As a result, the resulting capacitance exhibited by capacitor network 82 transforms the voltage spike generated by VSG 12 into a particular voltage spike waveform having particular required waveform characteristics.

Next, VSG 12 is activated to output a voltage spike into high voltage and common inputs 48 and 49, respectively. Capacitor network 80 transforms the voltage spike into the desired voltage spike waveform as described in the foregoing description. Switch 50 is adjusted so that the aforementioned predetermined voltage spike waveform is applied to the high voltage output 44 and common output 46 of calibrator 10 which in turn causes the predetermined voltage spike waveform to be applied to the high voltage and common inputs 16 and 18, respectively, of UUT 14. Monitoring circuit 92 enables the actual waveform that is inputted into the UUT 14 to be monitored and evaluated to ensure that the waveform inputted into the UUT 14 is the proper waveform for the particular test being conducted. If after reviewing the waveform with monitoring circuit 92, switch 90 can be adjusted to provide a different resulting capacitance between nodes 64 and 66.

In order to conduct the high-to-ground test, switch 50 is adjusted so that each pair of switch contacts shown in each row of Table III are electrically connected together.

TABLE III

| SW1-11 | SW1-13 |
| SW1-21 | SW1-23 |
| SW1-31 | SW1-33 |
| SW1-51 | SW1-53 (open circuit) |
| SW1-41 | SW1-43 |
| SW1-81 | SW1-83 |

For example, switch contact SW1-11 and SW1-13 are connected together, switch contacts SW1-51 and SW1-53 are connected together, and switch contacts SW1-81 and SW1-83 are connected together. As a result of each pair of switch contacts in each row of Table III being connected together. As a result of the pairs of switch contacts shown above being connected together, the VSG high voltage input 48 is connected to one end of resistor R1. The other end of series resistor R1 is connected to high voltage output 44 via switch contacts SW1-31 and SW1-33. The high voltage input 38 is connected directly to high voltage output 44 via switch contacts SW1-13 and SW1-11. VSG common input 49 is connected to node 64. Node 66 is connected to ground input 42 via switch contacts SW1-81 and SW1-83. The common input 40 is connected to node 60 via switch contacts SW1-41 and SW-43.

Next, switch 90 is configured to exhibit the desired resulting capacitance for capacitor networks 80 and 82 suitable for high-to-ground test. Since switch contact SW1-41 is connected to SW1-43, which is connected to common input 40, and switch contacts SW1-81 and SW1-83 are connected together, the resulting capacitance of capacitor network 82 is connected between common input 40 and ground input 42, and the resulting capacitance of capacitor network 80 is connected between VSG common input 49 and ground input 42. Next, the VSG 12 is activated to output a voltage spike into high voltage and common inputs 48 and 49, respectively. The resulting capacitances exhibited by capacitor networks 80 and 82 transform the voltage spike generated by VSG 12 into a particular voltage spike waveform having a particular waveform characteristics. The setting of switch 50 causes this particular voltage spike waveform to be applied to high voltage output 44 and ground output 47. As a result, the waveform is applied to high voltage and ground inputs 16 and input 20, respectively, of UUT 14.

Monitoring circuit 92 allows for the waveform that is inputted into the UUT 14 to be monitored and evaluated to ensure that the waveform inputted into the UUT 14 is the proper waveform for the particular test being conducted.

In order to conduct the common-to-ground test, switch 50 is adjusted so that each pair of switch contacts shown in each row of Table IV are electrically connected together.

TABLE IV

| SW1-11 | SW1-14 |
| SW1-21 | SW1-24 |
| SW1-31 | SW1-34 |
| SW1-51 | SW1-54 (open circuit) |
| SW1-41 | SW1-44 |
| SW1-81 | SW1-84 |

High voltage input 38 is connected to high voltage 44, the VSG high voltage input 48 is connected to one end of resistor R1, the other end of resistor R1 is connected to common output 46 via switch contacts SW1-31 and SW1-34, and node 66 is connected to ground input 42. The high voltage input 38 is connected to high voltage output 44 via switch contacts SW1-11 and SW1-14. The high voltage input 38 is also connected to node 60 of capacitor network 60 via switch contacts SW1-41 and SW-44. Thus, the resulting capacitance of capacitor network 82 is connected between high voltage input 38 and ground input 42, and the resulting capacitance of capacitor network 80 is connected between the VSG common input 49 and ground input 42. Next, switch 90 is adjusted so that capacitor networks 80 and 82 exhibit the desired resulting capacitances appropriate to common-to-ground test.

Next, the VSG 12 is activated to output a voltage spike into VSG inputs 48 and 49. The resulting capacitances exhibited by capacitor networks 80 and 82 transform the voltage spike generated by VSG 12 into a particular voltage spike waveform having particular waveform characteristics. This waveform is applied to the common and ground outputs 46 and 47, respectively, of calibrator 10, and as a result, the waveform is inputted into the common and ground inputs 18 and 20, respectively, of UUT 14. Monitoring circuit 92 allows for the monitoring of the actual waveform inputted into UUT 14 as described in the foregoing description.

Referring to FIG. 2, switch 50 includes additional groups 50$g$ and 50$h$ of switch contacts. Monitoring circuit 92 comprises groups 50$g$ and 50$h$ of switch contacts, resistors R2 and R3, capacitor C4, and test ports 100 and 102. Group 50$g$ comprises switch contacts SW1-61, SW1-62, SW1-63 and SW1-64. Group 50$h$ comprises switch contacts SW1-71, SW1-72, SW1-73, and SW1-74. Resistors R2 and R3 are connected in series between switch contacts SW1-61 and SW1-71. Capacitor C4 is connected in parallel with resistor R2. In one embodiment, resistor R2 has a resistance of one kilo-ohm, resistor R3 has a resistance of about ninety-nine kilo-ohms, and capacitor C4 has a capacitance of about 27 pf (picofarads). Test port 100 is connected to switch contact SW1-61 and test port 102 is connected to the junction of resistors R2 and R3. When switch 50 is configured to implement the line-to-line test, switch contact SW1-61 is connected to switch contact SW1-62, and switch contact SW1-71 is connected to switch contact SW1-72. In turn, switch contact SW1-62 is connected to high voltage output 44, and switch contact SW1-72 is connected to common output 46. When switch 50 is configured to implement the high-to-ground test, switch contact SW1-61 is connected to switch contact SW1-63, and switch contact SW1-71 is connected to switch contact SW1-73. In turn, switch contact SW1-63 is connected to high voltage output 44, and switch contact SW1-73 is connected to node 66. When switch 50 is configured to implement the common-to-ground test, switch contact SW1-61 is connected to switch contact SW1-64, and switch contact SW1-71 is connected to switch contact SW1-74. In turn, switch contact SW1-64 is connected to common output 46 and switch contact SW1-74 is connected to node 66.

Calibrator 10 further includes outputs 104 and 106 that are connected to one end of fuse 52 and one end of fuse 63, respectively. Outputs 104 and 106 are used for synchronization with other test equipment.

In one embodiment, each switch 50 and 90 is configured as a seven deck rotary switch. However, suitable switches can be used as well.

The present invention allows for one test set up for all required test conditions while UUT 14 is energized. The present invention also allows for the changing of test instrumentation while UUT 14 is energized. The present invention allows for variation of the phase in which the voltage spike is induced. This phase variation can be performed while UUT 14 is energized. It is not necessary to de-energize, rewire circuitry, and then re-energize UUT 14 in order to adjust the phase in which the voltage spike is induced.

The present invention provides a technique for testing the compatibility and survivability of electrical devices which is relatively more safe and efficient than prior art techniques. Furthermore, the present invention minimizes test set-up and reconfiguration time. Additionally, calibrator 10 can be realized inexpensively with commercially available electrical components.

Another important feature of the present invention is that calibrator 10 is portable and can be easily transported and integrated with the other devices and test equipment.

The principals, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations in changes may be made by those skilled in the art without departing from the spirit of the invention. Accordingly, the foregoing detailed description should be considered exemplary in nature and not limited to the scope and spirit of the invention as set forth in the attached claims.

What is claimed is:

1. An apparatus for calibrating voltage spikes used in testing an electrical device, comprising:
   an input for receiving a voltage spike;
   power supply inputs for receiving power for energizing the electrical device under test, the power supply inputs comprising a high voltage input, a common input and a ground input;
   a plurality of outputs comprising a high voltage output, a common output, and a ground output, the plurality of outputs being configured for connection to corresponding high voltage, common and ground inputs of the electrical device, the common power supply input and ground power supply input being connected to the common output and ground output, respectively; and
   a circuit joined to selectably connect and disconnect the power supply high voltage input to and from, respectively, the high voltage output, said circuit further joined to select a pair of the plurality of outputs, said circuit being capable of transforming the voltage spike received at the input into a predetermined voltage spike waveform for application to the selected pair of outputs.

2. The apparatus according to claim 1 wherein the circuit comprises a capacitive circuit having a variable capacitance such that the capacitive circuit exhibits a selected capacitance of a plurality of preselected capacitances, the predetermined voltage spike waveform being based on the selected capacitance exhibited by the capacitive circuit.

3. The apparatus according to claim 1 wherein the input for receiving the voltage spike comprises a high voltage spike input and a common voltage spike input, and wherein the circuit transforms the voltage spike into a first predetermined voltage spike waveform, attenuates the high voltage power supply input from the high voltage output, connects the high voltage spike input to the high voltage output, and applies the first predetermined voltage spike waveform to the high voltage output and common output.

4. The apparatus according to claim 3 wherein the circuit is capable of transforming the voltage spike into a second predetermined voltage spike waveform and can apply the second predetermined voltage spike waveform to the high voltage and ground outputs.

5. The apparatus according to claim 4 wherein the circuit is capable of transforming the voltage spike into a third predetermined voltage spike waveform and can apply the third predetermined voltage spike waveform to the common voltage and ground outputs.

6. The apparatus according to claim 5 wherein the circuit comprises a capacitive circuit having a variable capacitance such that the capacitive circuit exhibits a selected capacitance of a plurality of preselected capacitances, each of the first, second and third predetermined voltage spike waveforms being based on the selected capacitance exhibited by the capacitive circuit.

7. The apparatus according to claim 6 wherein the capacitive circuit comprises:

a plurality of capacitors; and a switch for selecting at least one of said plurality of capacitors to provide a resulting capacitance that is to be exhibited by the capacitive circuit.

8. The apparatus according to claim 7 wherein when the switch selects a plurality of capacitors, the selected plurality of capacitors are connected in a parallel circuit.

9. The apparatus according to claim 1 wherein the circuit comprises a switch for selecting the pair of the plurality of outputs to which the predetermined voltage spike waveform is applied.

10. The apparatus according to claim 1 further comprising a monitoring circuit joined to the circuit of said plurality of outputs for monitoring the predetermined voltage spike waveform.

11. A method of testing an electrical device, comprising:

providing an electrical device under test having high voltage, common and ground inputs;

providing a power source for energizing the electrical device under test wherein the power source has high voltage, common and ground outputs and connecting the common and ground outputs of the power source to the common and ground inputs, respectively, of the electrical device under test;

selecting a pair of inputs of the electrical device;

connecting the power supply high voltage input to the high voltage input of the electrical device under test if the selected pair of inputs comprises the high voltage and common inputs of the electrical device;

generating a voltage spike;

transforming the voltage spike into a predetermined voltage spike waveform; and applying the predetermined voltage spike waveform to the selected pair of inputs of the electrical device under test.

12. The method according to claim 11 further comprising the step of providing a capacitive circuit having a variable capacitance and wherein the step of transforming comprises varying the capacitance of the capacitive circuit to exhibit a particular capacitance upon which the predetermined voltage spike waveform is based.

13. The method according to claim 11 wherein when the selected pair of the plurality of inputs comprises the high voltage and common inputs of the electrical device under test, the step of transforming comprises transforming the voltage spike into a first predetermined voltage spike waveform, and the step of applying comprises applying the first predetermined voltage spike waveform to the high voltage and common inputs of the electrical device under test.

14. The method according to claim 13 further comprising:

transforming the voltage spike into a second predetermined voltage spike waveform;

selecting the high voltage and ground inputs of the electrical device under test; and applying the predetermined voltage spike waveform to the high voltage and ground inputs of the electrical device under test.

15. The method according to claim 14 further comprising:

transforming the voltage spike into a third predetermined voltage spike waveform;

selecting the common and ground inputs of the electrical device under test; and applying the predetermined voltage spike waveform to the common voltage and ground inputs of the electrical device under test.

16. The method according to claim 15 wherein each of the first, second and third predetermined voltage spike waveforms has different waveform characteristics.

17. The method according to claim 11 further including monitoring the predetermined voltage spike waveform.

* * * * *